(12) United States Patent
Yokoi

(10) Patent No.: US 9,598,166 B2
(45) Date of Patent: Mar. 21, 2017

(54) WINDOW OF AN AIRCRAFT WITH AN ELECTROMAGNETIC SHIELD

(71) Applicant: MITSUBISHI AIRCRAFT CORPORATION, Aichi (JP)

(72) Inventor: Takashi Yokoi, Aichi (JP)

(73) Assignee: MITSUBISHI AIRCRAFT CORPORATION, Aichi (JP)

(*) Notice: Subject to any disclaimer, the term of this patent is extended or adjusted under 35 U.S.C. 154(b) by 82 days.

(21) Appl. No.: 14/361,560

(22) PCT Filed: Dec. 13, 2012

(86) PCT No.: PCT/JP2012/007963
§ 371 (c)(1),
(2) Date: May 29, 2014

(87) PCT Pub. No.: WO2013/105178
PCT Pub. Date: Jul. 18, 2013

(65) Prior Publication Data
US 2014/0319277 A1 Oct. 30, 2014

(30) Foreign Application Priority Data
Jan. 11, 2012 (JP) .................. 2012-003147

(51) Int. Cl.
*B64C 1/14* (2006.01)
*H05K 9/00* (2006.01)

(52) U.S. Cl.
CPC .......... *B64C 1/1484* (2013.01); *B64C 1/1492* (2013.01); *H05K 9/0005* (2013.01); *Y10T 156/10* (2015.01)

(58) Field of Classification Search
CPC ... B64C 1/1476; B64C 1/1484; B64C 1/1492; H05K 9/0005; H05K 9/0094
(Continued)

(56) References Cited

U.S. PATENT DOCUMENTS 2,497,507 A * 2/1950 McMaster ............. B64C 1/1484
219/201
3,542,939 A * 11/1970 Ezra ........................ B65H 81/00
174/358

(Continued)

FOREIGN PATENT DOCUMENTS

JP 2000-286591 A 10/2000
JP 2003-523911 A 8/2003
(Continued)

OTHER PUBLICATIONS

Xingcun Colin Tong, Advanced Materials and Design for Electromagnetic Interference Shielding, CRC Press, 2008 (Nov. 19, 2008).*
(Continued)

*Primary Examiner* — Tien Dinh
*Assistant Examiner* — Alexander V Giczy
(74) *Attorney, Agent, or Firm* — Pearne & Gordon LLP

(57) ABSTRACT

A window of an aircraft having electromagnetic shielding performance and environment-resistant sealing performance, an aircraft, and an assembly method for a window of an aircraft are provided. A conductive seal member (60) is provided so as to face and surround the peripheral side surface of a window panel and is sandwiched between a conductive film (41) and an outer retainer (22). In the conductive seal member (60), thin wire materials (62) made of a conductive material such as aluminum are embedded in a seal member body (61) made of a material, such as silicone rubber, having an electric insulating property, waterproofness and pliability. An electromagnetic shielding effect, and environment-resistant sealing properties such as an electric insulating property and waterproofness can be both ensured by the conductive seal member (60).

19 Claims, 5 Drawing Sheets

(58) Field of Classification Search
USPC .......................... 52/204.53, 204.54, 204.55
See application file for complete search history.

(56) References Cited

U.S. PATENT DOCUMENTS

| | | | | |
|---|---|---|---|---|
| 4,003,621 | A * | 1/1977 | Lamp | H01R 12/714 439/586 |
| 4,037,009 | A * | 7/1977 | Severinsen | B32B 25/10 174/357 |
| 4,778,950 | A * | 10/1988 | Lee | H01L 25/0657 174/260 |
| 4,823,229 | A * | 4/1989 | Waterland, III | B60J 10/00 174/356 |
| 4,933,227 | A * | 6/1990 | Stewart | B32B 17/10018 156/102 |
| 5,147,694 | A * | 9/1992 | Clarke | B32B 17/10055 174/389 |
| 8,714,487 | B2 * | 5/2014 | Yokoi | B32B 17/10045 244/129.3 |
| 2003/0087048 | A1 * | 5/2003 | Chaussade | B64C 1/1492 428/34 |
| 2005/0039936 | A1 * | 2/2005 | Hikita | B64C 1/1492 174/389 |
| 2008/0130260 | A1 * | 6/2008 | Kouda | F16J 15/064 361/818 |
| 2012/0125660 | A1 * | 5/2012 | Bright | C22C 5/06 174/126.4 |

FOREIGN PATENT DOCUMENTS

| | | |
|---|---|---|
| JP | 2004-359221 A | 12/2004 |
| JP | 2011225076 A * | 11/2011 |
| WO | 2011/132349 A1 | 10/2011 |

OTHER PUBLICATIONS

JP 2000286591A (as dislosed by Applicant), english machine translation.*

Kamalsinh V. Jadeja (Lamar Stonecypher, ed), "What are the Common Insulating Materials Used in Electrical Engineering?", Bright Engineering Hub, updated Sep. 6, 2011, http://www.brighthubengineering.com/commercial-electrical-applications/124315-common-insulating-materials-used-in-electrical-engineering/, accessed Dec. 11, 2015.*

MIL-G-47197B, Military Specification, "Gasket, Shielding, Electronic-Oriented Wires Embedded in Silicone Rubber, Pressure Seal", Apr. 27, 1987.*

International Search Report for Application No. PCT/JP2012/007963 dated Mar. 19, 2013.

* cited by examiner

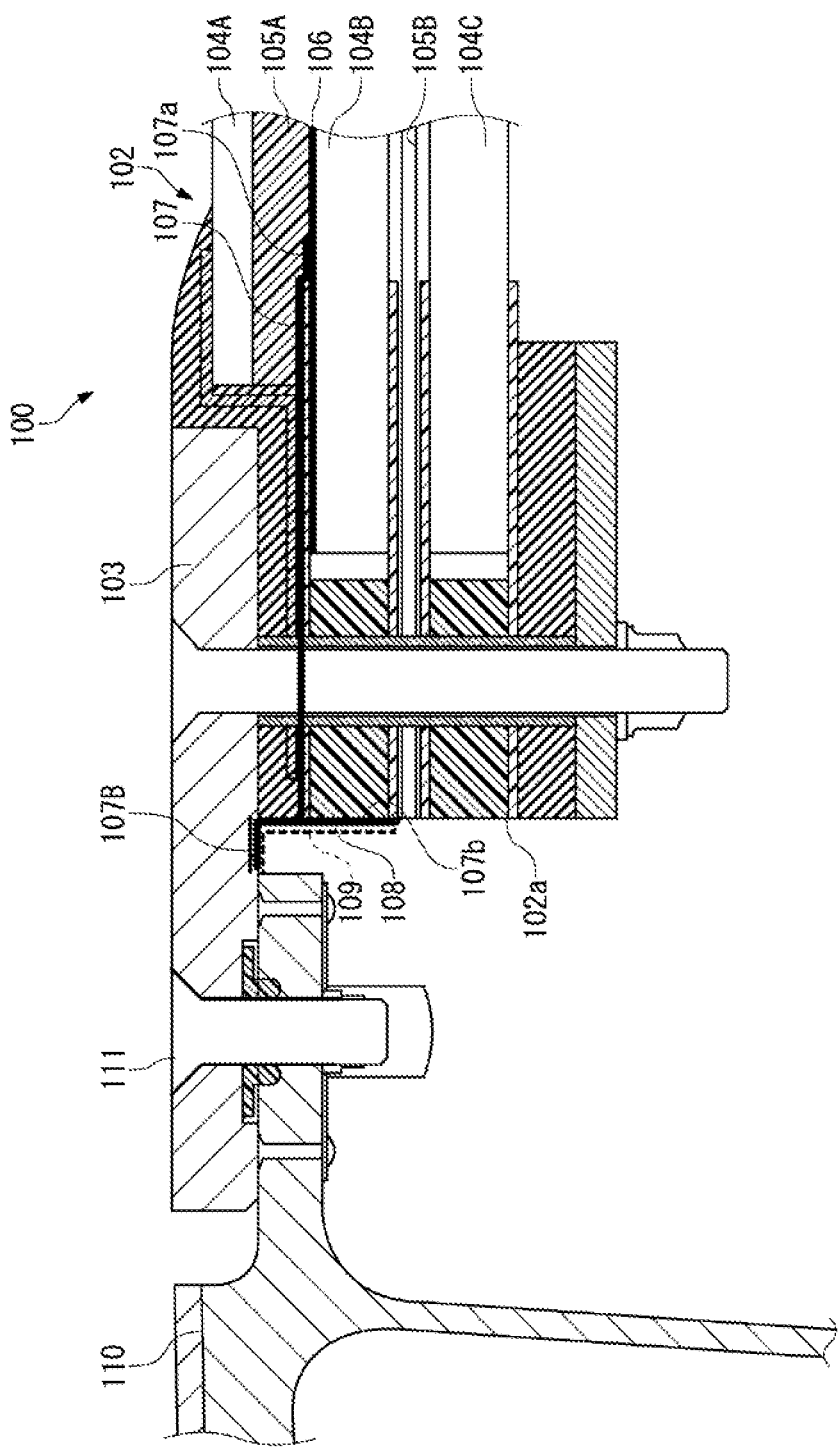
FIG. 5 —Prior Art—

WINDOW OF AN AIRCRAFT WITH AN ELECTROMAGNETIC SHIELD

TECHNICAL FIELD

The present invention relates to a window of an aircraft with an electromagnetic shield, an aircraft, or the like.

BACKGROUND ART

Aircraft must be able to fly safely with no malfunction or upset caused during a cruising flight or during landing and takeoff under high intensity radiated fields (HIRF) as an electromagnetic environment from radios, televisions, radars, emitters and other sources. Therefore, HIRF protection measures required in (14CFR) SS23.1308, 25.1317, 27.1317, and 29.1317, High-intensity Radiated Fields (HIRF) protection, which stipulates Regulations (airworthiness requirements) of FAA (Federal Aviation Administration) need to be taken.

Recently, the importance of protection of electric/electronic systems of aircraft has been significantly increasing because of the following reasons:
1) a greater dependence on electric/electronic systems that execute required functions for continued safe flight and landing and takeoff of aircraft;
2) a decrease in electromagnetic shielding by a certain type of composite material used in design of aircraft;
3) an increase in susceptibility (sensitivity) of electric/electronic systems to HIRF along with increases in operating speed of data buses or processors, density of ICs or cards, and sensitivity of electronics;
4) an expansion of a usage frequency particularly to a high-frequency band of 1 GHz or more;
5) an increase in severity of an HIRF environment along with an increase in the number of RF transmitters and electric power; and
6) an adverse effect on part of aircraft when exposed to HIRF.

Meanwhile, inside aircraft, there may be an adverse effect on, for example, communications with an airport control tower, and communications or control of navigation for a flight along a predetermined route due to radio waves or electromagnetic noise (simply referred to as electromagnetic noise below) from various electronics such as mobile phones, game machines, and notebook computers, or PEDs (Personal Electro Devices) such as active-type RFID (Radio Frequency IDentification) tags attached to air cargos. Thus, as is well known, passengers are asked to refrain from using various electronics inside aircraft.

Since airframes of aircraft are generally formed of a metal material, electromagnetic noise enters and exits a cockpit (a flight deck) and an avionics bay from a cabin (a seat space) mainly through a cabin window and a cockpit window. To prevent the electromagnetic noise that possibly causes a failure from entering the cockpit or the avionics bay, a film of ITO (Indium Tin Oxide), gold, silver or the like is provided so as to be inserted into the cabin window obtained by laminating a plurality of window panels made of acrylic or the like (e.g., see Patent Literature 1).

As shown in FIG. 5, a window 100 includes a window section 102, and an outer retainer 103 that surrounds an entire outer peripheral portion of the window section 102.

The window section 102 includes a plurality of, (three in the present embodiment) laminated window panels 104A to 104C.

Resin films 105A and 105B made of PVB (polyvinyl butyral) or the like are respectively sandwiched between the window panels 104A and 104B, and between the window panels 104B and 104C.

An electromagnetic shielding film 106 is sandwiched between the resin film 105A and the window panel 104B. The electromagnetic shielding film 106 is a thin film formed of a conductive material such as ITO, gold and silver.

One end 107a of a conductive tape 107 is adhered to an outer peripheral portion of the electromagnetic shielding film 106. The other end 107b of the conductive tape 107 projects to the outer peripheral side from the window section 102, and is bent along an outer peripheral end surface 102a of the window section 102.

A second conductive tape 108 is adhered to the outer peripheral end surface 102a of the window section 102 so as to cover the other end 107b of the conductive tape 107. The second conductive tape 108 is bent along the outer retainer 103. The second conductive tape 108 is attached and grounded to a grounding area 107B formed in the outer retainer 103.

Accordingly, the electromagnetic shielding film 106 is electrically connected to an airframe 110 via a pin 111 that connects the conductive tape 107 and the second conductive tape 108 to the outer retainer 103, and the outer retainer 103 to the airframe 110. The electromagnetic shielding film 106 is electrically connected to the airframe 110 as described above to thereby express an electromagnetic shielding effect.

A weather seal 109 made of silicone sealant or the like is also provided so as to cover the second conductive tape 108 provided on the outer peripheral end surface 102a of the window section 102. An environment-resistant seal for acquiring waterproofness, moisture proofness, and airtightness is thereby obtained.

CITATION LIST

Patent Literature

Patent Literature 1: National Publication of International Patent Application No. JP2003-523911, also published as FR2793106 (A1)

SUMMARY OF INVENTION

Technical Problem

However, the second conductive tape 108 may peel off when repetitively deformed due to a difference between internal and external pressures, or when used for a long period of time. Thus, it is necessary to periodically check and, if necessary, replace the second conductive tape 108, which takes time and cost.

In assembly, the weather seal 109 needs to be formed by applying polysulfide or silicone sealant onto the second conductive tape 108 after attaching the second conductive tape 108 to the outer peripheral end surface 102a of the window section 102, which takes time.

The present invention has been made based on the technical problems as described above, and an object of the present invention is to easily and inexpensively provide a window of an aircraft having sufficient electromagnetic shielding performance and environment-resistant sealing performance, an aircraft, and an assembly method for a window of an aircraft.

Solution to Problem

To achieve the above object, a window of an aircraft according to the present invention includes: a transparent window panel; an inner retainer and an outer retainer that are provided on an outer peripheral portion of the window panel so as to sandwich the window panel therebetween; an electromagnetic shielding film that is made of a conductive material; a connecting film that is made of a conductive material, one end of the connecting film being connected to the electromagnetic shielding film; and a conductive seal member that is provided so as to surround an outer peripheral side of the window panel, and sandwiched between another end of the connecting film and the outer retainer, wherein the conductive seal member includes a seal member body and a conductive member, the seal member body having an electric insulating property, and the conductive member electrically connecting the another end of the connecting film and the outer retainer.

As described above, in the present invention, the single conductive seal member can exert both of environment-resistant sealing performance for acquiring waterproofness, moisture proofness, and airtightness, and electromagnetic shielding performance. That is, the environment-resistant sealing performance for acquiring waterproofness, moisture proofness, and airtightness can be ensured by the seal member body having an electric insulating property of the conductive seal member. The connecting film and the outer retainer can be electrically connected by the conductive member of the conductive seal member. Accordingly, the electromagnetic shielding film is electrically connected to an airframe via the connecting film, the conductive member, and the outer retainer, so that an electromagnetic shielding effect can be obtained.

In the conductive seal member, a wire-like material may be embedded as the conductive member in the seal member body. The wire-like material may be deformable when the seal member body is compressed in a direction connecting the another end of the connecting film and the outer retainer. In the conductive seal member, a thickness in a non-compressed state may be set to be larger than a thickness when the seal member body is compressed between the another end of the connecting film and the outer retainer.

Accordingly, the seal member body is compressively deformed by fastening the inner retainer and the outer retainer by a fastening member with the conductive seal member sandwiched between the outer retainer and the connecting film. The sealing performance can be thereby reliably exerted.

The present invention may be an aircraft including the window of an aircraft as described above.

Moreover, the present invention may be an assembly method for the window of an aircraft as described above, including the steps of: laminating the window panel and the electromagnetic shielding film; connecting the one end of the connecting film to the electromagnetic shielding film; sandwiching the conductive seal member between the another end of the connecting film and the outer retainer; and sandwiching the outer peripheral portions of the window panel and the electromagnetic shielding film laminated together between the inner retainer and the outer retainer.

Advantageous Effects of Invention

In accordance with the present invention, the conductive seal member can exert the environment-resistant sealing performance for achieving waterproofness, moisture proofness, and airtightness, and the electromagnetic shielding effect. The conductive seal member can be easily mounted only by sandwiching the conductive seal member between the outer retainer and the connecting film. The above effect can be inexpensively and easily obtained.

BRIEF DESCRIPTION OF DRAWINGS

FIG. 5 is a sectional view illustrating a sectional structure of a conventional cockpit window, and a mounting structure thereof to an airframe.

DESCRIPTION OF EMBODIMENTS

In the following, the present invention is described in detail based on an embodiment shown in the accompanying drawings.

Figure 1:
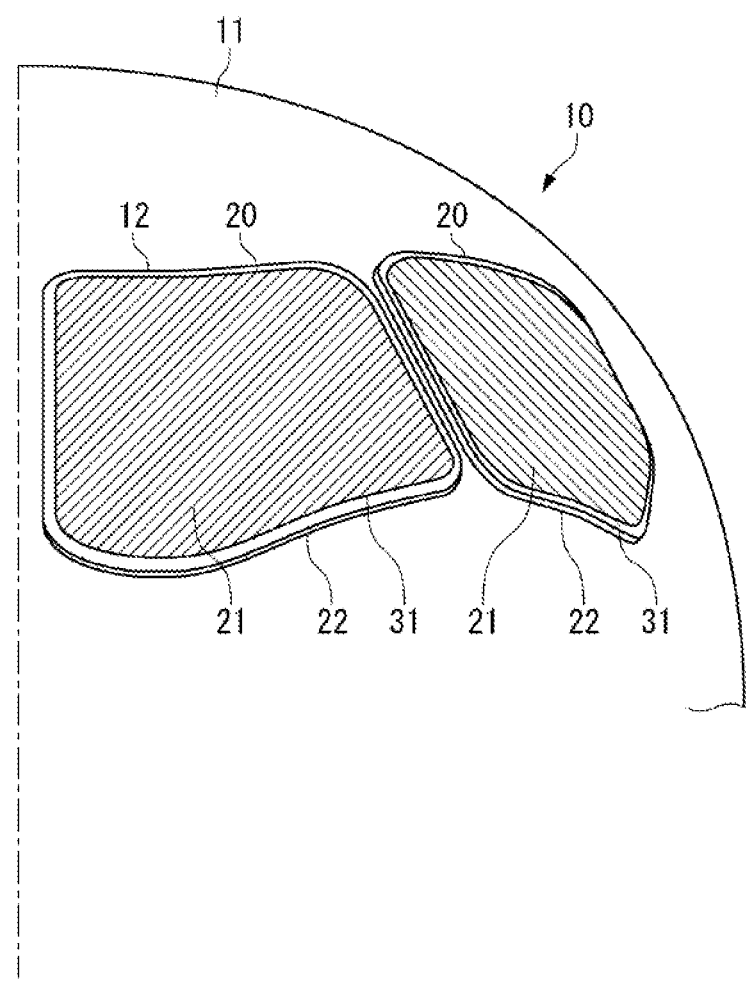
FIG. 1 is a view illustrating a cockpit portion of an aircraft in a present embodiment.

FIG. 1 is a view for explaining a configuration of a window 20 of an aircraft 10 in the present embodiment.

As shown in FIG. 1, the window 20 is provided at the front of a cockpit of the aircraft 10.

Figure 2:
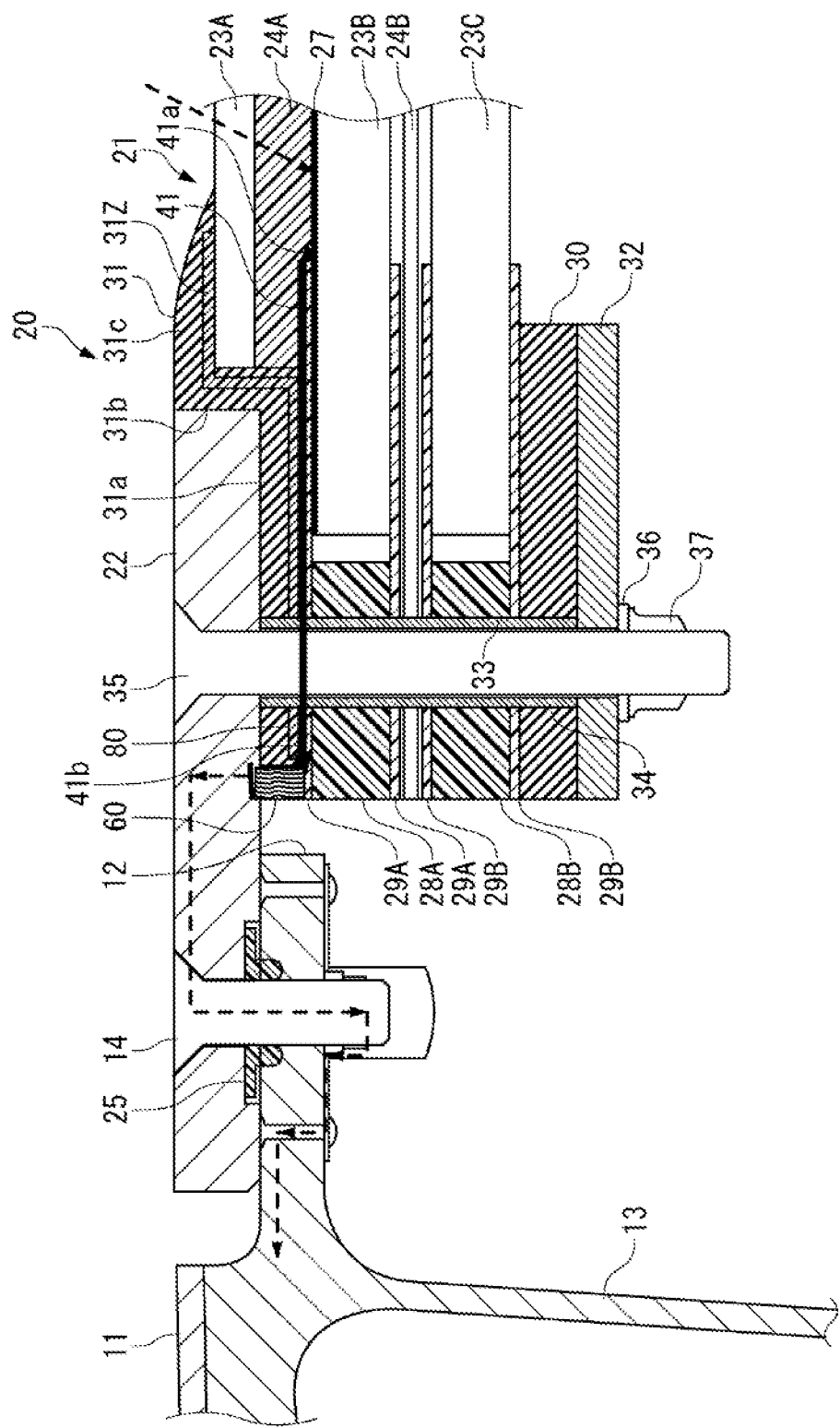
FIG. 2 is a sectional view illustrating a sectional structure of a cockpit window, and a mounting structure thereof to an airframe.

As shown in FIG. 2, the window 20 is mounted to a window frame 12 that is formed on an outer skin 11 constituting an airframe of the aircraft 10. The window 20 includes a window section 21, and an outer retainer 22 that surrounds an entire outer peripheral portion of the window section 21.

The window section 21 includes a plurality of, (three in the present embodiment) laminated window panels 23A to 23C. In the window 20 as a main window, at least the window panel 23A, which is an outermost layer facing the outside of the airframe of the aircraft 10, out of the window panels 23A to 23C is made of glass. In the present embodiment, all of the window panels 23A to 23C are made of glass.

Resin films 24A and 24B made of PVB (polyvinyl butyral) or the like are respectively sandwiched between the window panels 23A and 23B, and between the window panels 23B and 23C.

An electromagnetic shielding film 27 is sandwiched between the resin film 24A and the window panel 23B. The electromagnetic shielding film 27 is a thin film formed of a conductive material such as ITO, metal and silver.

Spacers 28A and 28B respectively having the same thickness as the window panels 23B and 23C are provided on outer peripheral portions of the window panels 23B and 23C so as to surround the entire peripheries. The spacers 28A and 28B are fastened to the window panels 23B and 23C by straps 29A and 29B. The straps 29A and 29B are respectively provided on front and rear surfaces of the spacer 28A and front and rear surfaces of the spacer 28B. The spacers 28A and 28B, and the straps 29A and 29B are made of, for example, fiber glass.

The spacers 28A and 28B, and the resin film 24B project to the outer peripheral side relative to the window panel 23A, the resin film 24A, and the electromagnetic shielding film 27.

A weather seal 31 made of a rubber-based material, resin or the like is provided between the outer peripheral portion of the window section 21 and the outer retainer 22, specifically, on a portion along the outer peripheral portion of a surface of the window panel 23A, and a surface of the window panel 23B projecting to the outer peripheral side therefrom. The weather seal 31 is provided so as to surround the entire outer peripheral portion of the window section 21. The weather seal 31 has a crank-like sectional shape composed of a portion 31a along the spacer 28A and the window panel 23B, a portion 31b rising along outer peripheral surfaces of the resin film 24A and the window panel 23A, and a portion 31c along the surface of the window panel 23A. The weather seal 31 includes a Z retainer (a core material) 31Z having a similar crank-like sectional shape. The Z retainer 31Z is made of a nonconductive material (e.g., fiber glass).

The weather seal 31, the spacers 28A and 28B, and the resin film 24B are sandwiched between the outer retainer 22 made of metal (a conductive material), which is disposed outside, and a seal material 30 and an inner retainer 32, which are disposed inside, in a portion projecting to the outer peripheral side from the window panel 23A. A through hole 33 is formed in the outer retainer 22, the weather seal 31, the spacer 28A, the resin film 24B, the spacer 28B, the seal material 30, and the inner retainer 32. A tubular sleeve 34 having a predetermined length is fitted into an inner peripheral surface of the through hole 33. A distance between the outer retainer 22 and the inner retainer 32 is thereby regulated.

A fastener (a fastening member) 35 is inserted into the through hole 33. A washer 36 and a nut 37 are fitted to a distal end portion of the fastener 35 that projects to the inside of the airframe from the inner retainer 32. The weather seal 31, the window panels 23B and 23C, and the resin film 24B are thereby fastened and fixed by the outer retainer 22 and the inner retainer 32.

The outer retainer 22 is fastened to a spar material 13 constituting the airframe of the aircraft 10 by a fastening member 14 such as a bolt and a rivet. The spar material 13 is made of metal as a conductive material. The outer skin 11 is fixed to one side of the spar material 13, and the outer retainer 22 is fixed to the other side of the spar material 13 via a seal material 25.

In the above configuration, the electromagnetic shielding film 27 is formed on the inner side (the center side) of the window section 21 from the portion fastened by the outer retainer 22 and the inner retainer 32. This is to prevent the electromagnetic shielding film 27 from peeling off by a fastening force of the outer retainer 22 and the inner retainer 32. When the electromagnetic shielding film 27 is provided on the inner side from the portion fastened by the outer retainer 22 and the inner retainer 32, the fastening force of the outer retainer 22 and the inner retainer 32 does not directly act on the electromagnetic shielding film 27.

Figure 3:
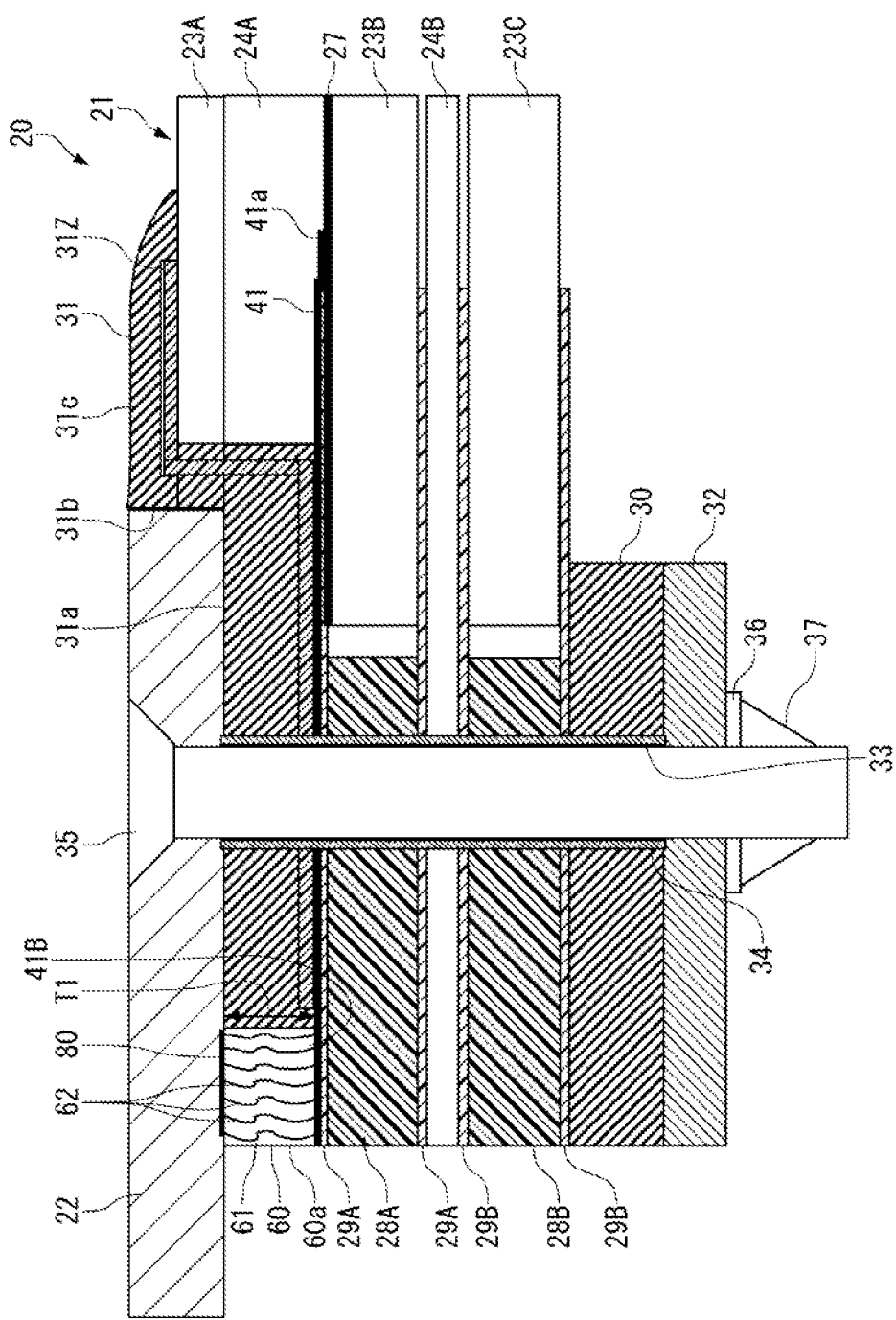
FIG. 3 is an enlarged view of a main portion in FIG. 2.

As shown in FIGS. 2 and 3, a conductive film (a connecting film) 41 made of a material such as Ag, Al, Ni, and Cu and having pliability is provided on an outer peripheral edge portion of the electromagnetic shielding film 27 so as to surround the entire periphery of the electromagnetic shielding film 27. One end 41a of the conductive film 41 is electrically connected to the electromagnetic shielding film 27. The conductive film 41 is also sandwiched between the surface of the window panel 23B and the weather seal 31, and extended to the same position as outer peripheral portions of the spacers 28A and 28B and the straps 29A and 29B.

A conductive seal member 60 is provided on an outer peripheral portion of the weather seal 31 so as to surround the entire outer peripheral portion of the window section 21. That is, the conductive seal member 60 is provided so as to surround the outer peripheral side of the window panels 23A to 23C. The conductive seal member 60 is also sandwiched between the other end 41b of the conductive film 41 and the outer retainer 22.

Figure 4:
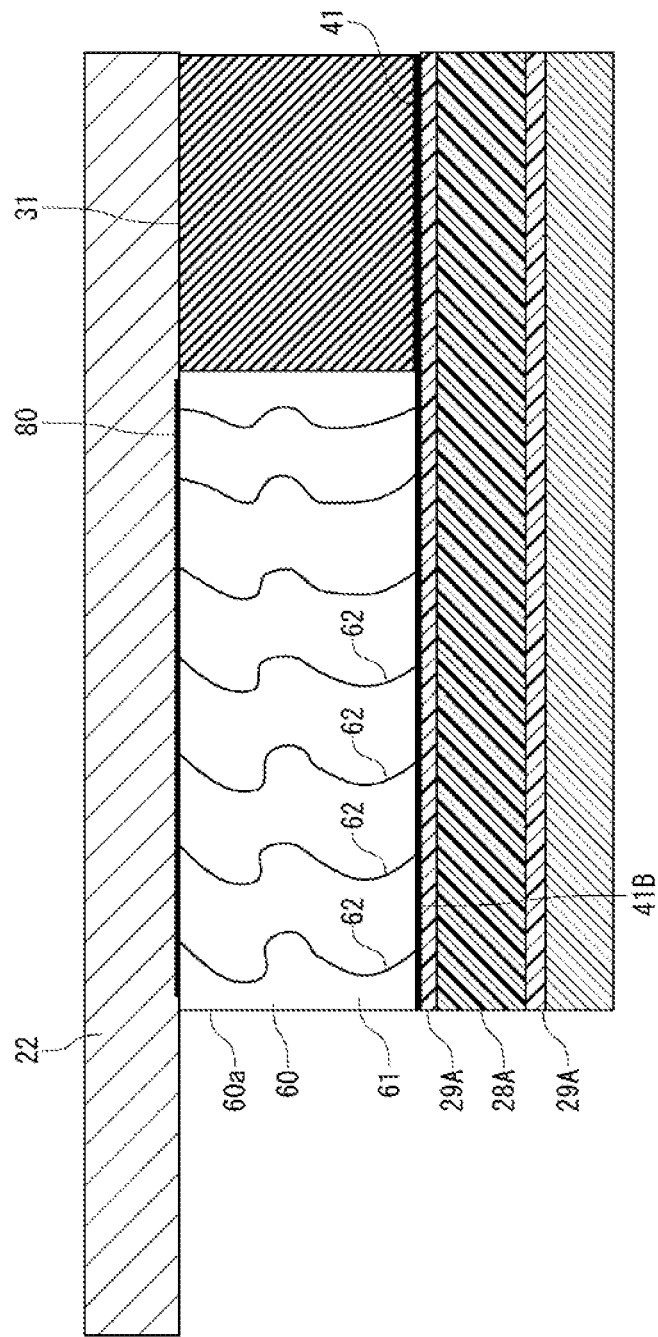
FIG. 4 is an enlarged view illustrating a configuration of a conductive seal member.

As shown in FIGS. 3 and 4, in the conductive seal member 60, thin wire-like materials (conductive members) 62 made of a conductive material such as aluminum are embedded in a seal member body 61 made of a material, such as silicone rubber, having an electric insulating property, waterproofness and pliability. The wire-like materials 62 are respectively embedded in the seal member body 61 so as to extend in a direction to connect the conductive film 41 and the outer retainer 22. The wire-like materials 62 are provided in the conductive seal member 60 so as not to be exposed on a side surface 60a partially constituting an outer peripheral end surface 21a of the window section 21. Thus, the side surface 60a of the conductive seal member 60 is formed by the seal member body 61.

The wire-like materials 62 are preferably formed of a material having a small potential difference (e.g., a potential difference of 0.15 V or less) from the materials forming the outer retainer 22 and the conductive film 41. The wire-like materials 62 are set to a material and a line diameter having such flexibility that the wire-like materials 62 are axially deformable along with compressive deformation of the seal member body 61 when the conductive seal member 60 is compressed in the direction in which the wire-like materials 62 extend.

The conductive seal member 60 is formed such that a non-compressed thickness in an initial state is larger than a distance T1 between the conductive film 41 and the outer retainer 22. The wire-like material 62 has a length corresponding to the thickness of the conductive seal member 60 in the non-compressed state.

When the window section 21 is fastened by the fastener 35, the conductive seal member 60 is compressed between the conductive film 41 and the outer retainer 22. The wire-like materials 62 embedded in the seal member body 61 thereby project from the front and rear sides of the seal member body 61. The wire-like materials 62 projecting from the front and rear sides stick into the conductive film 41 and the outer retainer 22.

The outer retainer 22 is almost entirely anodized for anticorrosion. Only a portion of the outer retainer 22 in contact with the conductive seal member 60 is subjected to conductive surface treatment using alodine, iridoid or the like to form a grounding section 80. The wire-like materials 62 of the conductive seal member 60 are electrically connected to the grounding section 80.

In accordance with the above configuration, the electromagnetic shielding film 27 is electrically connected to the spar material 13 and the outer skin 11 constituting the airframe via the conductive film 41, the wire-like materials 62 of the conductive seal member 60, the outer retainer 22, and the fastening member 14. Accordingly, a sufficient electromagnetic shielding effect can be obtained.

In the conductive seal member 60, the side surface 60a partially constituting the outer peripheral end surface 21a of the window section 21 is formed by the seal member body 61. Accordingly, an electric insulating property, waterproofness, and airtightness can be ensured by the seal member body 61 at the outer peripheral portion of the window section 21.

As described above, the electromagnetic shielding effect, and the environment-resistant sealing properties such as the electric insulating property and the waterproofness can be ensured by the conductive seal member 60. Moreover, it is only necessary to sandwich the conductive seal member 60 between the conductive film 41 and the outer retainer 22 in the assembly of the window 20. Thus, a conventional operation of attaching a conductive tape 108, or applying silicone sealant or the like for forming a weather seal 109 is not required. Therefore, the operation can be easily and reliably performed.

Only by sandwiching the conductive seal member 60 where the wire-like materials 62 are embedded in the seal member body 61 between the conductive film 41 and the outer retainer 22, and fastening the conductive seal member 60 by using the fastener 35, the seal member body 61 is compressed, and the wire-like materials 62 are exposed to stick into the conductive film 41 and the outer retainer 22. Accordingly, conductivity can be easily and reliably ensured. Moreover, since the plurality of wire-like materials 62 pass electricity between the conductive film 41 and the outer retainer 22, contact resistance can be suppressed. The electric conductivity can be thereby improved.

The aforementioned configuration can be changed as appropriate without departing from the scope of the present invention.

For example, in the above embodiment, the number of layers, the laminate configuration, the material or the like of the window panels constituting the window section 21 may be changed as appropriate. The electromagnetic shielding film 27 may be also provided on a layer other than the above layer.

Although the cockpit window 20 is described as an example in the above embodiment, the present invention may be similarly applied to a window provided in another portion of the airframe of the aircraft 10, such as a cabin window.

The constitutions described in the embodiment described above may be also freely selected or changed into other constitutions without departing from the scope of the present invention.

REFERENCE SIGNS LIST

10 aircraft
11 outer skin
12 window frame
13 spar material
14 fastening member
20 window
21 window section
21*a* outer peripheral end surface
22 outer retainer
23A to 23*c* window panel
24A, 24B resin film
27 electromagnetic shielding film
28A, 28B spacers
29A, 29B straps
30 seal material
31 weather seal
31Z Z retainer
32 inner retainer
33 hole
34 tubular sleeve
35 fastener (fastening member)
36 washer
37 nut
41 conductive film (connecting film)
41*a* one end
41*b* other end
60 conductive seal member
60*a* side surface
61 seal member body
62 wire-like material (conductive member)
80 grounding section
100 window
102 window section
102*a* outer peripheral end surface
103 outer retainer
104A to 104C window panels
105A, 105B resin films
107 conductive tape
107*a* one end
107*b* other end
107B grounding area
108 conductive tape
109 weather seal
110 airframe
111 pin

The invention claimed is:

1. A window of an aircraft with an electromagnetic shield, comprising:
   a transparent window panel having an outer surface, an inner surface, and a peripheral side surface connecting the outer surface and the inner surface;
   an inner retainer and an outer retainer that are provided on an outer peripheral portion of the window panel so as to sandwich the window panel therebetween;
   an electromagnetic shielding film that is made of a conductive material;
   a connecting film that is made of a conductive material, one end of the connecting film being connected to the electromagnetic shielding film; and
   a conductive seal member that is provided so as to face and surround the peripheral side surface of the window panel, and sandwiched between another end of the connecting film and the outer retainer,
   wherein there is a space at an outside of a peripheral side surface of the conductive seal member, and
   wherein the conductive seal member includes a seal member body and a conductive member, the seal member body having an electric insulating property and the conductive member electrically connecting the another end of the connecting film and the outer retainer.

2. The window of an aircraft according to claim 1, wherein in the conductive seal member, a wire material is embedded as the conductive member in the seal member body.

3. The window of an aircraft with an electromagnetic shield according to claim 2, wherein in the conductive seal member, a thickness in a non-compressed state is set to be larger than a thickness when the seal member body is compressed between the another end of the connecting film and the outer retainer.

4. The window of an aircraft according to claim 2, wherein the wire material is embedded in the seal member body such that when the seal member body is compressed between the connecting film and the outer retainer, the wire material projects from front and rear sides of the seal member body into the connecting film and the outer retainer.

5. The window of an aircraft according to claim 2, wherein the wire material is deformable when the seal member body is compressed in a direction connecting the another end of the connecting film and the outer retainer.

6. The window of an aircraft with an electromagnetic shield according to claim 5, wherein in the conductive seal member, a thickness in a non-compressed state is set to be larger than a thickness when the seal member body is compressed between the another end of the connecting film and the outer retainer.

7. The window of an aircraft with an electromagnetic shield according to claim 1, wherein in the conductive seal member, a thickness in a non-compressed state is set to be larger than a thickness when the seal member body is compressed between the another end of the connecting film and the outer retainer.

8. The window of an aircraft according to claim 1, wherein the seal member body having the electric insulating property comprises a portion of the conductive seal member that faces the peripheral side surface of the window panel.

9. The window of an aircraft according to claim 1, wherein the conductive seal member comprises a side surface that partially constitutes a peripheral end surface of the window, wherein the conductive member is provided so as not to be exposed on the side surface.

10. The window of an aircraft according to claim 1, wherein the connecting film does not extend beyond the peripheral side surface of the conductive seal member.

11. The window of an aircraft according to claim 1, wherein the conductive seal member is spaced from a fastener that fixes the window panel between the inner retainer and the outer retainer.

12. An aircraft comprising the window of an aircraft according to claim 1.

13. An aircraft comprising the window of an aircraft according to claim 2.

14. An aircraft comprising the window of an aircraft according to claim 5.

15. An aircraft comprising the window of an aircraft according to claim 7.

16. An assembly method for assembling the window of the aircraft according to claim 1, comprising steps of:
   laminating the window panel and the electromagnetic shielding film together;
   connecting the one end of the connecting film to the electromagnetic shielding film;
   sandwiching the conductive seal member between the another end of the connecting film and the outer retainer; and
   sandwiching the outer peripheral portions of the window panel and the electromagnetic shielding film laminated together between the inner retainer and the outer retainer.

17. An assembly method for assembling the window of the aircraft according to claim 2, comprising steps of:
   laminating the window panel and the electromagnetic shielding film together;
   connecting the one end of the connecting film to the electromagnetic shielding film;
   sandwiching the conductive seal member between the another end of the connecting film and the outer retainer; and
   sandwiching the outer peripheral portions of the window panel and the electromagnetic shielding film laminated together between the inner retainer and the outer retainer.

18. An assembly method for assembling the window of the aircraft according to claim 5, comprising steps of:
   laminating the window panel and the electromagnetic shielding film together;
   connecting the one end of the connecting film to the electromagnetic shielding film;
   sandwiching the conductive seal member between the another end of the connecting film and the outer retainer; and
   sandwiching the outer peripheral portions of the window panel and the electromagnetic shielding film laminated together between the inner retainer and the outer retainer.

19. An assembly method for assembling the window of the aircraft according to claim 7, comprising steps of:
   laminating the window panel and the electromagnetic shielding film together;
   connecting the one end of the connecting film to the electromagnetic shielding film;
   sandwiching the conductive seal member between the another end of the connecting film and the outer retainer; and
   sandwiching the outer peripheral portions of the window panel and the electromagnetic shielding film laminated together between the inner retainer and the outer retainer.

* * * * *